(12) United States Patent
Mikami et al.

(10) Patent No.: US 9,167,065 B2
(45) Date of Patent: Oct. 20, 2015

(54) WATERPROOF STRUCTURE FOR ELECTRONIC DEVICE

(75) Inventors: Kensuke Mikami, Tokyo (JP); Toshinobu Ogatsu, Tokyo (JP); Nozomi Miki, Tokyo (JP)

(73) Assignee: NEC CORPORATION, Tokyo (JP)

( * ) Notice: Subject to any disclaimer, the term of this patent is extended or adjusted under 35 U.S.C. 154(b) by 965 days.

(21) Appl. No.: 13/320,135

(22) PCT Filed: Apr. 16, 2010

(86) PCT No.: PCT/JP2010/002778
§ 371 (c)(1),
(2), (4) Date: Nov. 11, 2011

(87) PCT Pub. No.: WO2010/131420
PCT Pub. Date: Nov. 18, 2010

(65) Prior Publication Data
US 2012/0058314 A1    Mar. 8, 2012

(30) Foreign Application Priority Data

May 15, 2009    (JP) ................................ 2009-119056

(51) Int. Cl.
*B32B 3/00* (2006.01)
*H04M 1/18* (2006.01)
*B32B 3/10* (2006.01)
*H05K 5/06* (2006.01)

(52) U.S. Cl.
CPC . *H04M 1/18* (2013.01); *B32B 3/10* (2013.01); *H05K 5/063* (2013.01); *Y10T 428/24802* (2015.01)

(58) Field of Classification Search
CPC .................................. H05K 5/06; H05K 5/063
See application file for complete search history.

(56) References Cited

U.S. PATENT DOCUMENTS

2003/0002247 A1* 1/2003 Yanagisawa .................. 361/683
2005/0003219 A1* 1/2005 Yonei et al. ................ 428/484.1

FOREIGN PATENT DOCUMENTS

| JP | 6-177550 A | 6/1994 |
| JP | 7-283554 A | 10/1995 |
| JP | 9-67456 A | 3/1997 |
| JP | 2002341964 A | 11/2002 |
| WO | WO 2007131647 A2 * | 11/2007 |

OTHER PUBLICATIONS

International Search Report for PCT/JP2010/002778 mailed May 18, 2010.

* cited by examiner

*Primary Examiner* — Gerard Higgins
*Assistant Examiner* — Sathavaram I Reddy
(74) *Attorney, Agent, or Firm* — Sughre Mion, PLLC

(57) ABSTRACT

A waterproof structure of the present invention is for an electronic device including a housing including a first case member that has a first abutting face, and a second case member that has a second abutting face that faces the first abutting face. A water repellent treatment is applied to the first and second abutting faces, and two or more boundaries that change from a region having a relatively small liquid droplet contact angle to a region having a relatively large liquid droplet contact angle are provided along a liquid infiltration direction at an abutting ends portion of the first and second case members.

7 Claims, 5 Drawing Sheets

WATERPROOF STRUCTURE FOR ELECTRONIC DEVICE

TECHNICAL FIELD

The present invention relates to a preferred waterproof structure that is applied to electronic devices such as a portable electronic device like a mobile telephone, a PHS, a personal digital assistant (PDA) and a smartphone.

BACKGROUND ART

In recent years, diversification of utilization forms of portable electronic devices has been progressing. Portable electronic devices are required to have many performance features such as voice service, e-mail, Web access, games, and TV reception while also being small and thin so as to allow use without impairing the portability. On the other hand, the usage environment of such portable electronic devices is also becoming diversified. For example, in damp environments such as in the rain and in the kitchen, and also in the bath and poolside, a high waterproof performance is required in order to allow use without malfunctioning.

As a general method of imparting a waterproof performance to a portable electronic device, a method is widely known that, in a device housing that includes at least of pair of casings, interposes a sealing material such as rubber or an elastomer at the abutting ends portion of the casings, and fills the gaps between the casings of the device housing by the repulsion force that occurs by compressing the casings with a pressing force.

For example, the technologies shown in Patent Document 1 and Patent Document 2 are disclosed as waterproof structures that do not use a sealing member.

In the portable electronic device that is shown in Patent Document 1, a waterproof structure is provided in which, in an exterior finish body having a split structure that includes an upper case member and a lower case member, the gap at the split portion between the upper case member and the lower case member increases from the inner side of the case member to the outer side. With this kind of waterproof structure, at the gap of the coupling portion of the upper case member and the lower case member, the dimension of the outside opening portion is set to be larger than the dimension of the inside opening portion. As a result, the water drop retention force at the outside opening portion is lower than the water drop retention force of the inside opening portion, and so water drops that have entered the gap are prevented from infiltrating into the inside.

In the waterproof container that is shown in Patent Document 2, a waterproof structure is provided in which two members that constitute a housing are abutted in a stepped shape having a fixed clearance therebetween, and a water-repellent film is formed on the abutting end faces of both members. Thus, the infiltration of water drops into the housing is prevented by the water-repellent film that is provided on the abutting end faces of both members.

PRIOR ART DOCUMENTS

Patent Documents

[Patent Document 1] Japanese Unexamined Patent Application, First Publication No. H07-283554
[Patent Document 2] Japanese Unexamined Patent Application, First Publication No. H09-67456

SUMMARY OF THE INVENTION

Problem to be Solved by the Invention

In the art disclosed in Patent Document 1, in order to increase the gap at the split portion between the upper case member and the lower case member from the inside to the outside of the case members, the facing surfaces of the upper case member and the lower case member are made to be sloped surfaces. It has been necessary to increase the outline dimensions of the case members in order to secure such sloped surfaces with a certain length. Thereby, the size of the case members increases, giving rise to the problem of impeding the miniaturization and slimming of portable electronic devices.

In the technology disclosed in Patent Document 2, once water breaches the end portion of the water repellent film and infiltrates the interior, it is not possible to suppress the further infiltration of water from then on. For this reason, there is the problem of the waterproof performance being insufficient.

The present invention has been conceived in view of the above circumstances, and has as its object to provide a waterproof structure for an electronic device that does not impede miniaturization and slimming, and has a sufficient effect to prevent the infiltration of water.

Means for Solving the Problem

In order to resolve the aforementioned issues, a waterproof structure of the present invention for an electronic device including a housing including a first case member that has a first abutting face, and a second case member that has a second abutting face that faces the first abutting face, a water repellent treatment is applied to the first and second abutting faces, and two or more boundaries that change from a region having a relatively small liquid droplet contact angle to a region having a relatively large liquid droplet contact angle are provided along a liquid infiltration direction at an abutting ends portion of the first and second case members.

Effect of the Invention

According to the present invention, the water repellent treatment is applied to the first and second abutting faces, and two or more boundaries that change from a region having a relatively small liquid droplet contact angle to a region having a relatively large liquid droplet contact angle are provided along a liquid infiltration direction at the abutting ends portion of the first and second case members. For this reason, even if water has infiltrated by breaching the first boundary, it is possible to suppress further infiltration of the water at the second and subsequent boundaries, and it is possible to impart sufficient waterproof performance to the housing of an electronic device.

With this kind of constitution, for example, by forming the aforementioned boundaries at the abutting ends portion of the case members formed in a two-dimensional planar shape, it is possible to reliably prevent the infiltration of water through the abutting ends portion, and there is no overall enlargement of the facing surfaces of the case members by forming them to sloped surfaces as before, and water does not all at once breach the end portion of a water-repellent film and infiltrate the interior as before.

That is to say, according to the waterproof structure of the present invention, since two or more boundaries that change from a region having a relatively small liquid droplet contact angle to a region having a relatively large liquid droplet contact angle are provided with respect to the liquid infiltration direction, it is possible to exhibit a sufficient water infiltration preventive effect that does not impede miniaturization and slimming.

EMBODIMENTS FOR CARRYING OUT THE INVENTION

First Exemplary Embodiment

In a first exemplary embodiment of the present invention, the constitution of the abutting ends portion of the housing of a portable electronic device shall be described with reference to FIG. 1 and FIG. 2.

Figure 1:
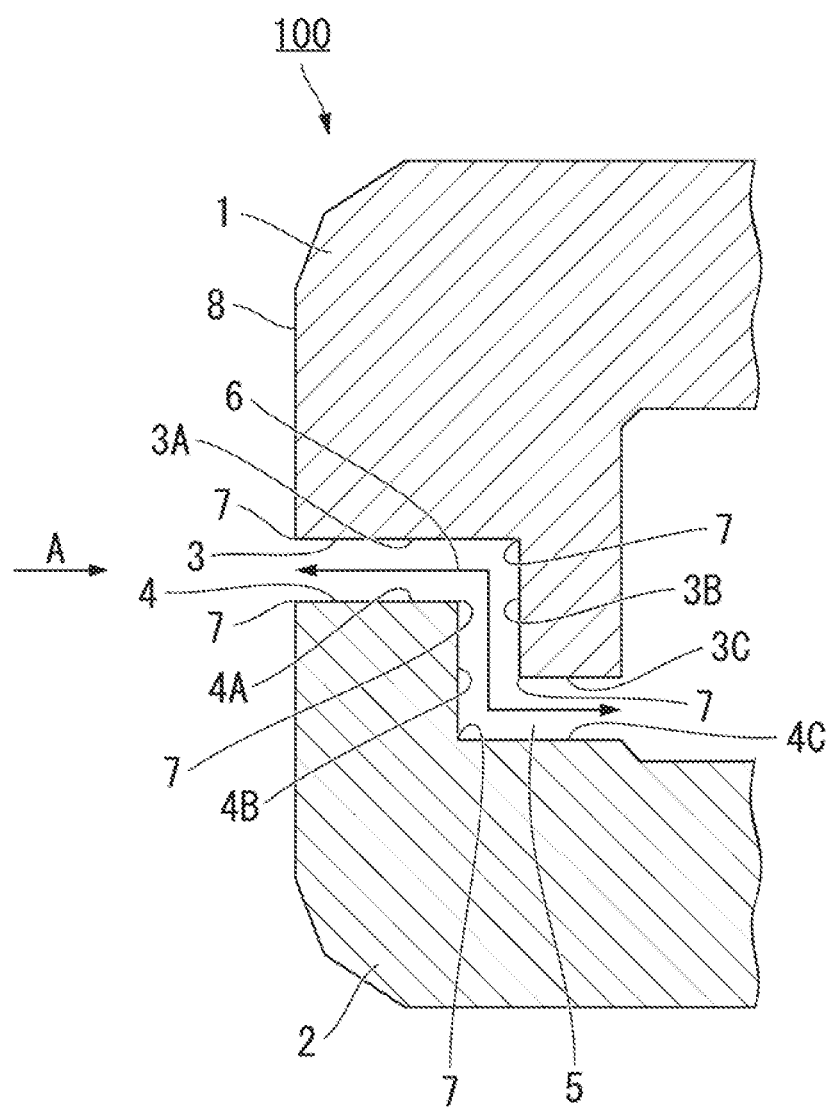
FIG. 1 is a cross-sectional view that shows abutting ends portion of case members of a portable electronic device according to a first exemplary embodiment of the present invention.

FIG. 1 is a cross-sectional view that shows a housing 100. The housing 100 includes a first case member 1 and a second case member 2. When the case member 1 and the case member 2 have been assembled, an end face 3 of the case member 1 and an end face 4 of the case member 2 are mutually abutted (this abutting ends portion is denoted by reference symbol 101).

This abutting ends portion 101 has a facing region 6 where the end face 3 of the case member 1 and the end face 4 of the case member 2 are oppositely arranged so as to be parallel via a constant gap 5. In this facing region 6, three abutting faces 3A to 3C and 4A to 4C are constituted at each of the end faces 3 and 4, with an edge portion 7 serving as a boundary line. These abutting faces 3A to 3C and 4A to 4C are formed in a stepped shape with the edge portion 7 serving as a boundary. Among these abutting faces 3A to 3C and 4A to 4C, the abutting faces 3A and 4A, the abutting faces 3B and 4B, and the abutting faces 3C and 4C are respectively arranged in an opposing positional relationship via the gap 5.

Figure 2:
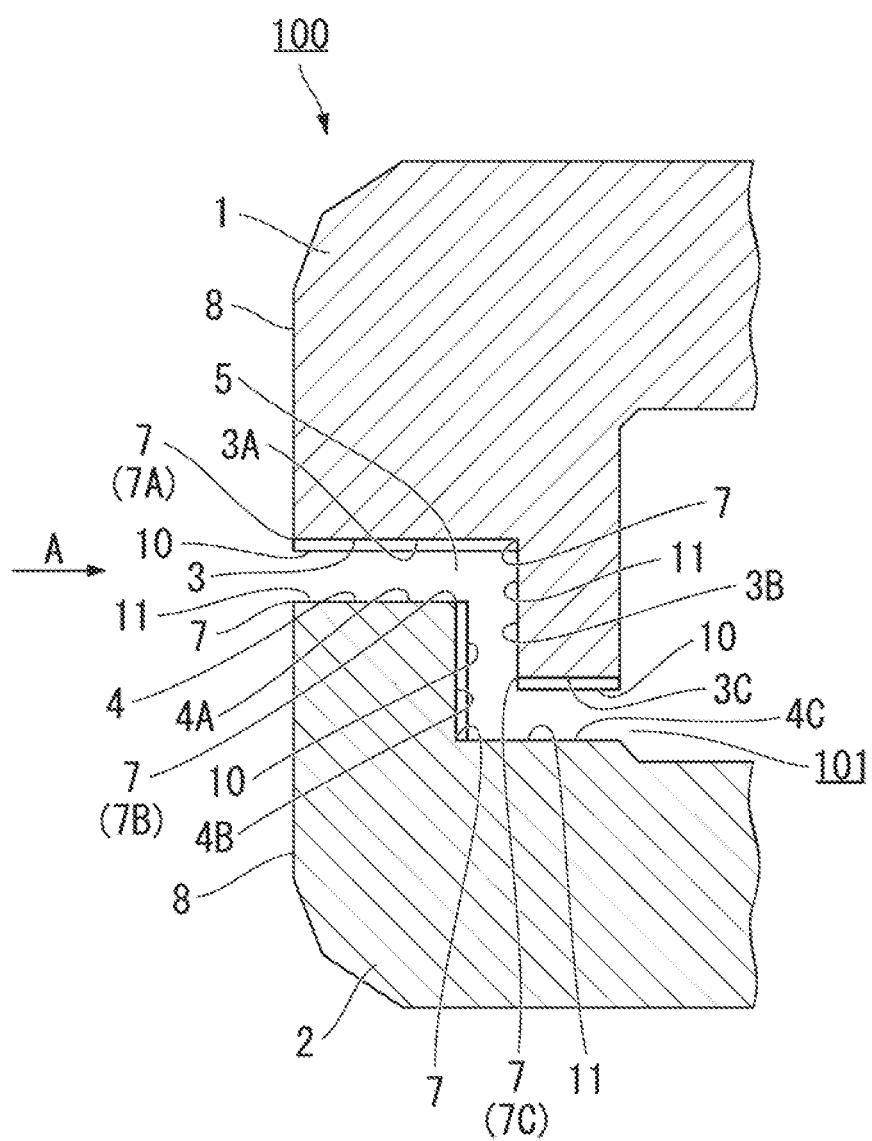
FIG. 2 is a cross-sectional view that shows the abutting ends portion of the case members of the portable electronic device according to the first exemplary embodiment of the present invention.

FIG. 2 is a cross-sectional view that shows in detail the abutting ends portion 101 shown in FIG. 1. By selectively performing a water repellent treatment on the abutting faces 3A to 3C and 4A to 4C that constitute the end faces 3 and 4 of the case members 1 and 2, the contact angle of liquid droplets is made larger on the surface of one case member 1 and 2 than the surface of the other case member 1 and 2 that opposes it.

Specifically, the abutting faces 3A and 3C of the case member 1 and the abutting face 48 of the case member 2 are made to serve as water repellent treated surfaces 10 that have been subjected to a water repellent treatment, and the abutting face 3B of the case member 1 and the abutting faces 4A and 4C of the case member 2 that are positioned opposite the water repellent treated surfaces 10 are made to serve as water repellent untreated surfaces 11 that are not subjected to a water repellent treatment. Thereby, the liquid droplet contact angle of the abutting faces 3A, 3C and 4B that serve as water repellent treated surfaces 10 are made to become larger than the liquid droplet contact angle of the abutting faces 3B, 4A and 4C that serve as water repellent untreated surfaces 11.

In the present first exemplary embodiment, the boundary between the water repellent treated surfaces 10 and the water repellent untreated surfaces 11 agrees with the boundaries between the three abutting faces 3A to 3C, or 4A to 4C that respectively constitute the end faces 3 and 4 of the case members 1 and 2, or with the edge portions 7 that are the boundaries between the vertical outer walls 8 of the case members 1 and 2 and the abutting faces 3A and 4A.

That is to say, the first characteristic of the first exemplary embodiment of the present invention is at least two boundaries being provided within the facing region 6 of the case members 1 and 2 that change along the water infiltration direction A from a region having a relatively small liquid droplet contact angle (the abutting faces 3B, 4A and 4C that serve as water repellent untreated surfaces 11) to a region having a relatively large liquid droplet contact angle (the abutting faces 3A, 3C and 4B that serve as water repellent treated surfaces 10). The first exemplary embodiment provides three of the edge portions 7 that serve as boundaries that change from the region having a relatively small liquid droplet contact angle (water repellent untreated surfaces 11) to the region having a relatively large liquid droplet contact angle (water repellent treated surfaces 10) as shown by the reference symbols 7A, 7B and 7C. Furthermore, the edge portions 7 (7A, 7B, 7C) that serve as boundaries are alternately provided in the first case member 1 and the second case member 2 with respect to the water infiltration direction A.

The effect of preventing infiltration of a liquid by controlling the liquid droplet contact angle of the abutting faces 3A to 3C and 4A to 4C of the case members 1 and 2 at the facing region 6 of the case members 1 and 2 in this way is occurs at the edge portions 7 (7A, 7B, 7C) that serve as boundaries that change from a region having a relatively small contact angle of liquid droplets to a region having a relatively large contact angle of liquid droplets in the liquid infiltration direction A. That is to say, by providing a plurality of edge portions 7 (7A, 7B, 7C) that serve as boundaries that change from the water repellent untreated surfaces 11 to the water repellent treated surfaces 10 in the water infiltration direction A, even if water has infiltrated by breaching the first boundary (edge portion 7A), it is possible to suppress further infiltration of the water at the second and subsequent boundaries (edge portions 7B and 7C).

The second characteristic of the first exemplary embodiment of the present invention is alternately providing the boundary that changes from the region having a relatively small liquid droplet contact angle (water repellent untreated surface 11) to a region having a relatively large liquid droplet contact angle (water repellent treated surface 10) on the surfaces of the case members 1 and 2 at the abutting ends portion 101 of the two case members 1 and 2, and also having that boundary agree with the edge portions 7 (7A, 7B, 7C) as described above.

Here, if the aforementioned boundary is provided without relation to the edge portions 7 (7A, 7B, 7C), it is necessary to form the boundary within the same abutting faces 3A to 3C and 4A to 4C. In the case of a portable electronic device, the width of the abutting faces 3A to 3C and 4A to 4C is 0.5 to 1 mm per each. For that reason, when attempting to form the boundary within the same abutting faces 3A to 3C and 4A to 4C, it is necessary to separately coat the water repellent treated surface 10 and the water repellent untreated surface 11 within that width. As a result, a detailed and highly accurate coating process is required.

For that reason, the abutting faces 3A to 3C and 4A to 4C that are partitioned by the edge portion 7 are made uniform surfaces of either the water repellent treated surface 10 or the water repellent untreated surface 11, and then the water repellent treated surface 10 and the water repellent untreated surface 11 are alternately provided with respect to the surfaces of the case members 1 and 2. With this kind of constitution, it is possible to secure a region that is comprised by the aforementioned water repellent treated surface 10 and the water repellent untreated surface 11 in a water repellent treatment region width that does not require detailed processing, that is, by a simple water repellent treatment process. Moreover, since the boundary between the aforementioned water repellent treated surface 10 and the water repellent untreated surface 11 coincides with the edge portion 7 that becomes the shape boundary, the coating also becomes visually easy.

In the first exemplary embodiment, the gap 5 at the abutting ends portion 101 of the case members 1 and 2 is fixed throughout the entire facing region 6, but the abutting faces 3A to 3C and the abutting faces 4A to 4C need not necessarily be parallel. In the case of assuming the abutting faces 3A to 3C and the abutting faces 4A to 4C to be not parallel, the arrangement of the water repellent treated surfaces 10 and the region width should be designed in view of maximum possible value of the gap 5 in the facing region 6.

For example, even if the gap 5 in a portable electronic device is set to zero at the design stage, the gap 5 between the two case members 1 and 2 cannot in reality be eliminated, with the gap 5 of around 0.2 mm existing at a maximum. Even in this case, in FIG. 2, setting the width of the abutting faces 3A to 3C and the abutting faces 4A to 4C, respectively, in the water infiltration direction A (the length with respect to the water infiltration direction A) to 0.5 mm, and providing the water repellent treatment on the surfaces of the case members 1 and 2 so as to satisfy the aforementioned characteristic, it is possible to obtain a sufficient water proof performance.

A treatment solution in which a polymer having high water repellency such as a fluororesin or silicon resin is dispersed is applied on the regions specified above with a dispenser or ink jet, and thereafter the liquid component is removed by drying, to thereby form the water repellent treated surfaces 10 on the surfaces of the case members 1 and 2.

Although the film thickness of the water repellent treatment film formed using the polymer dispersed treatment solution is not limited, a thickness of about 1 to 10 μm is preferable. This film thickness is a film thickness that can be formed without difficulty by the aforementioned coating method.

The liquid droplet contact angle of the water repellent treated surface 10 is determined by the type of polymer dispersed treatment solution. The greater the contact angle the more a water infiltration prevention effect can be expected. Therefore, a polymer dispersed treatment solution is used that has a contact angle of 100 degrees or more, and more preferably 110 degrees or more.

The material of the first case member 1 and the second case member 2 is not particularly limited, and it is possible to apply a resin material such as polycarbonate or ABS, or a metallic material such as stainless steel that are generally used in electronic devices. The greater the difference between the liquid droplet contact angle of the surface of the first case member 1 and the second case member 2 and the liquid droplet contact angle of the water repellent treated surface 10, the more a water infiltration prevention effect can be expected. Therefore, a member that has a contact angle of less than 90 degrees, and more preferably less than 70 degrees is used.

In the waterproof structure for an electric device shown in this first exemplary embodiment that has been described in detail above, at the abutting ends portion 101 defined by the case members 1 and 2 that constitute the housing 100, a plurality of the edge portions 7 (7A, 7B, 7C) that serve as boundaries that change from the region having a relatively small liquid droplet contact angle (water repellent untreated surface 11) to the region having a relatively large liquid droplet contact angle (water repellent treated surface 10) are alternately installed on the first case member 1 and the second case member 2 along the water infiltration direction A. With this kind of constitution, even if water has infiltrated by breaching the first boundary (edge portion 7A), it is possible to inhibit further infiltration of the water by the second and subsequent boundaries (edge portions 7B and 7C), and therefore it is possible to impart sufficient waterproof performance to the housing 100 of an electronic device.

Moreover, it is possible to prevent the infiltration of water by forming two or more of the edge portions 7 (7A, 7B, 7C) that serve as boundaries that change from the region having a relatively small liquid droplet contact angle (water repellent untreated surface 11) to the region having a large liquid droplet contact angle (water repellent treated surface 10) with respect to the infiltration direction A of a liquid. For this reason, by forming the aforementioned boundary at the abutting ends portion 101 of the case members 1 and 2 formed in a two-dimensional planar shape, it is possible to reliably prevent the infiltration of water through the abutting ends portion 101 (described further in a fourth exemplary embodiment), and so the overall structure does not increase in size due to making the facing surfaces of the case members sloped surfaces as before, and water does not all at once breach the end portion of a water-repellent film and infiltrate the interior as before.

That is to say, according to the waterproof structure of the present exemplary embodiment, it is possible to exhibit a sufficient water infiltration preventive effect that does not impede miniaturization and slimming, with the constitution of forming two or more boundaries that change from the region having a relatively small liquid droplet contact angle (water repellent untreated surface 11) to the region having a relatively large liquid droplet contact angle (water repellent treated surface 10) along the infiltration direction of a liquid, at the abutting ends portion 101 of the case members 1 and 2.

Furthermore, a water repellent treatment is performed on the surfaces of the case members 1 and 2 so that the contact angle of liquid droplets with respect to flat surfaces mutually differ for the opposing abutting faces 3A to 3C, and 4A to 4C that sandwich the gap 5. For this reason, it is possible to impart a sufficient waterproof performance with a simple water repellent treatment process, without forming a boundary within the same abutting faces 3A to 3C, and 4A to 4C.

The shape of the aforementioned edge portion 7 is shown to be linear in FIG. 2, but is not particularly limited thereto, and so may also have a curved shape that has a certain radius of curvature. In the first exemplary embodiment, a boundary that changes from the region having a relatively small liquid droplet contact angle (water repellent untreated surface 11) to the region having a relatively large liquid droplet contact angle (water repellent treated surface 10) is made to coincide with the edge portions 7 (7A, 7B, 7C). However, this not necessarily only indicates the case of the boundary being in complete agreement with the edge portions 7 (7A, 7B, 7C), but also includes the case of the boundary being in the vicinity of the edge portions 7.

Second Exemplary Embodiment

A second exemplary embodiment of the present invention shall be described with reference to FIG. 3. The waterproof structure shown in the second exemplary embodiment differs from the first exemplary embodiment in terms of the arrangement configuration of the water repellent treated surface 10 and the water repellent untreated surface 11.

Figure 3:
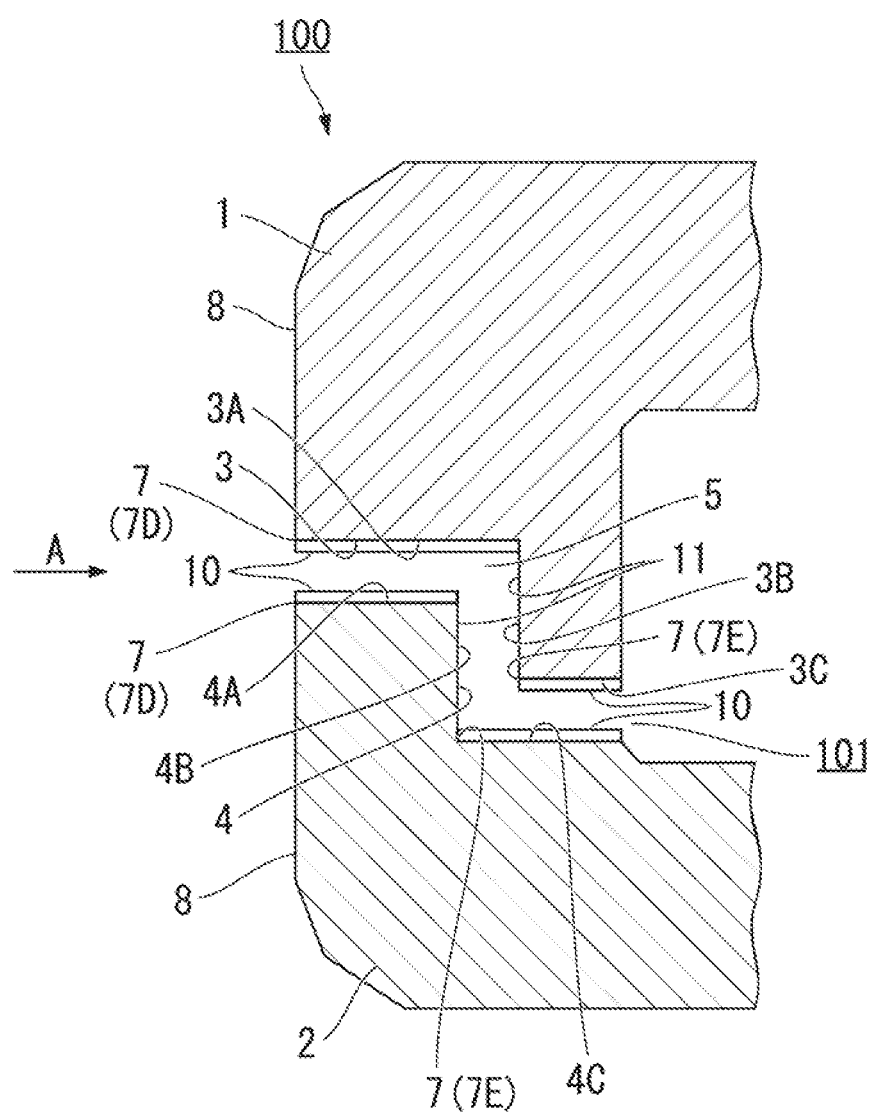
FIG. 3 is a cross-sectional view that shows the abutting ends portion of the case members of a portable electronic device according to Second exemplary embodiment of the present invention.

That is to say, as shown in FIG. 3, the abutting ends portion 101 of the case members 1 and 2 has a structure in which a water repellent treatment is partially applied to the abutting faces 3A to 3C and 4A to 4C. Such a structure is adopted for the following reasons. Specifically, this is in order for the contact angles of the abutting faces 3A to 3C, and 4A to 4C mutually facing each other of the case members 1 and 2 to be the same. Also, it is in order for there to be two or more boundaries that change from the region having a relatively small liquid droplet contact angle (water repellent untreated surface 11) to the region having a relatively large liquid droplet contact angle (water repellent treated surface 10) along the water infiltration direction A. Moreover, it is in order for the boundary between the water repellent treated surface 10 and the water repellent untreated surface 11 to coincide with the edge portion 7 that is a shape boundary.

Specifically, in the abutting ends portion 101 of the case members 1 and 2, the water repellent treatment is applied to the abutting faces 3A and 4A that are mutually opposing to make them into water repellent treated surfaces 10. The mutually opposing abutting faces 3B and 4B are made into water repellent untreated surfaces 11. And the water repellent treatment is applied to the abutting faces 3C and 4C that are mutually opposing to make them into water repellent treated surfaces 10. By doing so, the contact angles of the mutually opposing abutting faces 3A to 3C and 4A to 4C are set to become the same. Moreover, the boundary that changes from the region having a relatively small liquid droplet contact angle (water repellent untreated surface 11) to the region having a relatively large liquid droplet contact angle (water repellent treated surface 10) is made to agree with the aforementioned edge portions 7 (7D and 7E).

Here, the contact angles of the mutually opposing abutting faces 3A to 3C and 4A to 4C being the same means that the difference in contact angles between surfaces of both case members 1 and 2 is within 10 degrees, and more preferably within 5 degrees. In addition, the liquid droplet contact angles of both case members 1 and 2 are both 90 degrees or more, or both less than 90 degrees.

In the first exemplary embodiment and second exemplary embodiment, it is assumed that the boundaries that change from the region having a relatively small liquid droplet contact angle (water repellent untreated surface 11) to the region having a relatively large liquid droplet contact angle (water repellent treated surface 10) on the surfaces of both case members 1 and 2 along the water infiltration direction A agree. In this case, in the second exemplary embodiment, there are fewer boundaries indicated by the edge portions 7 (7D and 7E) in the facing region 6 compared to the first exemplary embodiment. However, since there is a water repellent effect by the respective water repellent treated surfaces 10 formed on the surfaces of both case members 1 and 2 in the boundaries, the water infiltration preventive effect per boundary becomes greater than that of the first exemplary embodiment, and so it is possible to obtain sufficient waterproof performance.

The waterproof structure for an electric device shown in this second exemplary embodiment that has been described in detail above is constituted by successively installing, at the abutting ends portion 101 defined by the case members 1 and 2 that constitute the housing 100, a plurality of the edge portions 7 (7D and 7E) that serve as boundaries that change from the region having a relatively small liquid droplet contact angle (water repellent untreated surface 11) to the region having a relatively large liquid droplet contact angle (water repellent treated surface 10) on the first case member 1 and the second case member 2 along the water infiltration direction A. With this kind of waterproof structure, even if water has infiltrated by breaching the first boundary (edge portion 7D), it is possible to inhibit further infiltration of the water by the second and subsequent boundaries (edge portion 7E), and it is possible to impart sufficient waterproof performance to the housing 100 of the electronic device.

In addition, according to the waterproof structure of the present exemplary embodiment, by forming two or more of each of the plurality of edge portions 7 (7D and 7E) that serve as boundaries that change from the region having a relatively small liquid droplet contact angle (water repellent untreated surface 11) to the region having a relatively large liquid droplet contact angle (water repellent treated surface 10) along the infiltration direction of a liquid, it is possible to exhibit a sufficient water infiltration preventive effect that does not impede miniaturization and slimming in the same manner as First exemplary embodiment.

Third Exemplary Embodiment

Figure 4:
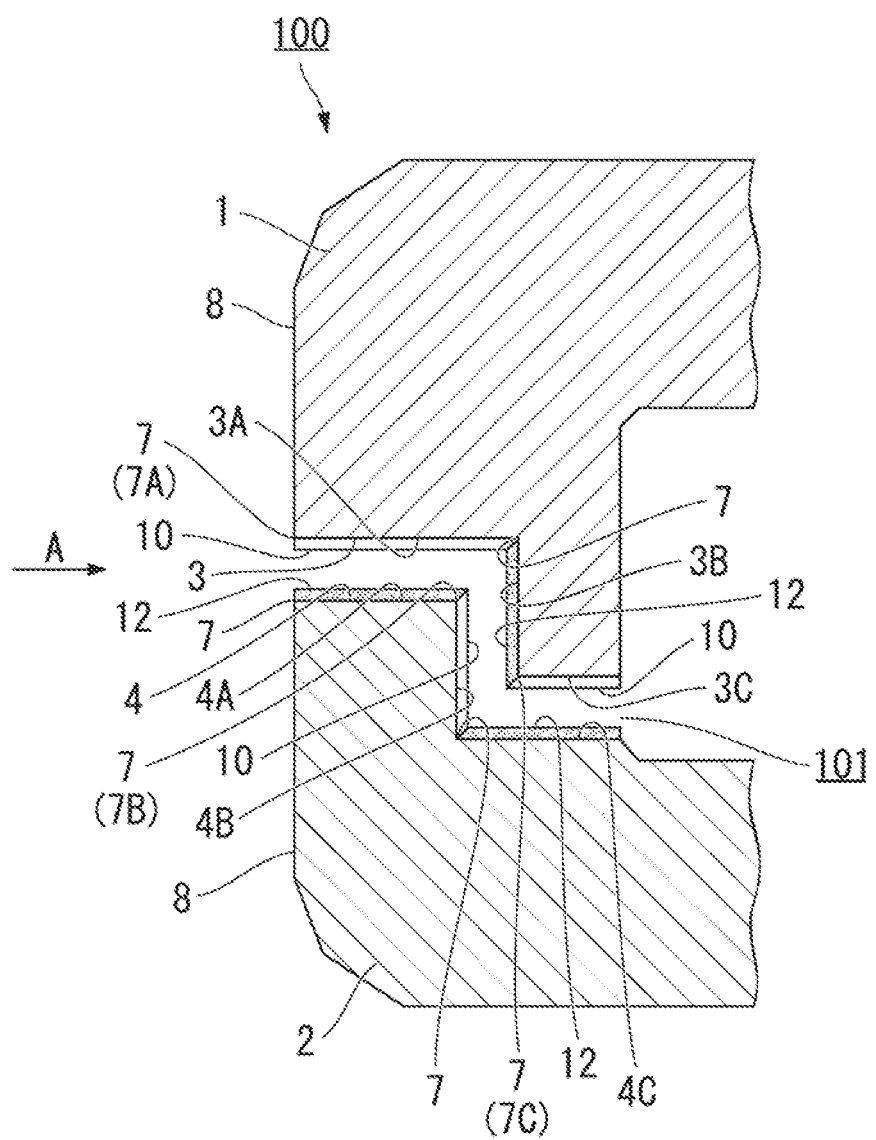
FIG. 4 is a cross-sectional view that shows abutting ends portion of case members of a portable electronic device according to a third exemplary embodiment of the present invention.

A third exemplary embodiment of the present invention shall be described with reference to FIG. 4. The waterproof structure shown in the third exemplary embodiment differs from the preceding exemplary embodiments on the point of providing a hydrophilic treated surface 12 in order to further reduce the liquid droplet contact angle, as a substitute for the water repellent untreated surface 11 shown in the waterproof structure of the first exemplary embodiment.

This hydrophilic treated surface 12 is formed by activating a component surface with a corona discharge treatment, ozone treatment, or plasma treatment in the state of the region which is not subject to hydrophilic treatment being masked. The liquid droplet contact angle of the hydrophilic treated surface 12 that is obtained using this kind of process differs depending on the type of case member 1 and 2, the treatment method, and treatment conditions, but directly after treatment is less than 40 degrees, and more preferably less than 10 degrees.

In the third exemplary embodiment, there are the problems of long-term durability of the hydrophilic treated surface 12, and the treatment process being complicated compared to the first exemplary embodiment. However, in the third exemplary embodiment, since the difference in liquid droplet contact angles of the hydrophilic treated surface 12 and the water repellent treated surface 10 becomes greater compared to the first exemplary embodiment, it is possible to obtain a more sufficient waterproof performance in the water repellent treated surface 10.

The waterproof structure for an electronic device shown in the third exemplary embodiment as described in detail above is constituted by alternately installing, at the abutting ends portion 101 defined by the case members 1 and 2 that constitute the housing 100, a plurality of edge portions 7 (7A, 7B, 7C) that serve as boundaries that change from the region having a relatively small liquid droplet contact angle (hydrophilic treated surface 12) to the region having a relatively large liquid droplet contact angle (water repellent treated surface 10) on the first case member 1 and the second case member 2 along the water infiltration direction A. With this kind of waterproof structure, even if water has infiltrated by breaching the first boundary (edge portion 7A), it is possible to inhibit further infiltration of the water by the second and subsequent boundaries (edge portions 7B, 7C), and it is possible to impart sufficient waterproof performance to the housing 100 of an electronic device. Moreover, since the difference in liquid droplet contact angles of the hydrophilic treated surface 12 and the water repellent treated surface 10 becomes greater, it is possible to obtain a more sufficient waterproof performance in the water repellent treated surface 10.

In addition, according to the waterproof structure of the present exemplary embodiment, by forming two or more of each of the plurality of edge portions 7 (7A, 7B, 7C) that serve as boundaries that change from the region having a relatively small liquid droplet contact angle (hydrophilic treated surface 12) to the region having a relatively large liquid droplet contact angle (water repellent treated surface 10) along the infiltration direction of a liquid, it is possible to exhibit a sufficient water infiltration preventive effect that does not impede miniaturization and slimming in the same manner as the aforementioned exemplary embodiments.

Fourth Exemplary Embodiment

Figure 5:
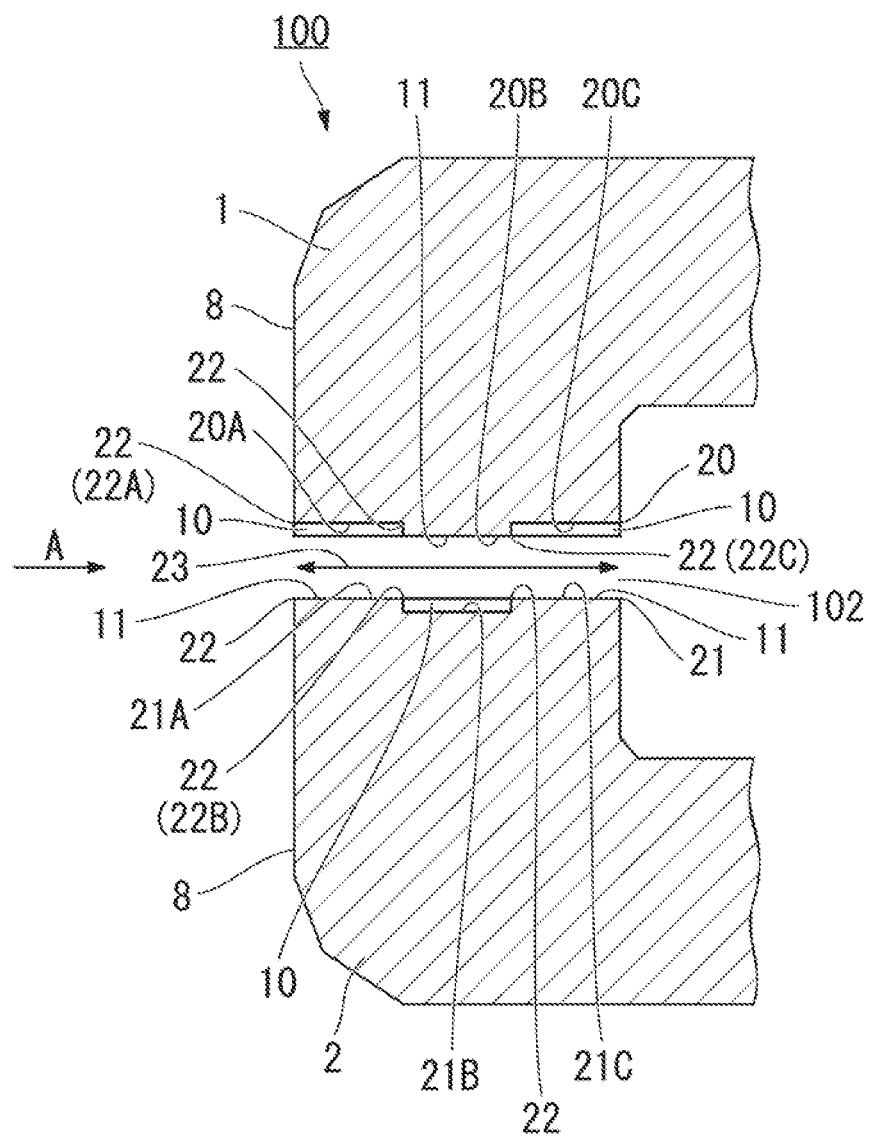
FIG. 5 is a cross-sectional view that shows abutting ends portion of case members of a portable electronic device according to a fourth exemplary embodiment of the present invention.

A fourth exemplary embodiment of the present invention shall be described with reference to FIG. 5. The waterproof structure shown in the fourth exemplary embodiment differs from the preceding exemplary embodiments on the point of the shape of the end faces 20 and 21 of the case members 1 and 2 that become the abutting ends portion 102.

That is to say, in the fourth exemplary embodiment, the end faces 20 and 21 of the case members 1 and 2 that become the abutting ends portion 102 are two-dimensional flat surfaces. In each end face 20, a region that includes three abutting faces 20A to 20C is formed via boundary portions 22. Also, in the end face 21, a region which that includes three abutting faces 21A to 21C is formed via boundary portions 22. By selectively performing a water repellent treatment on these abutting faces 20A to 20C and 21A to 21C, it is possible to make the liquid droplet contact angle on the surface of one case member 1 and 2 larger than that of the surface of the other case member 1 and 2 that opposes it.

Specifically, the abutting faces 20A and 20C of the case member 1 and the abutting face 21B of the case member 2 are made to serve as water repellent treated surfaces 10 that have been subjected to a water repellent treatment, and the abutting face 20B of the case member 1 and the abutting faces 21A and 21C of the case member 2 that are positioned opposite these water repellent treated surfaces 10 are made to serve as water repellent untreated surfaces 11 that are not subjected to a water repellent treatment. Thereby, the liquid droplet contact angle of the abutting faces 20A, 20C and 21B that become the water repellent treated surfaces 10 is made larger than the water droplet contact angle of the abutting faces 20B, 21A and 21C that become the water repellent untreated surfaces 11.

The characteristic of the present fourth exemplary embodiment is providing, within a facing region 23 of the case members 1 and 2, at least two or more of the boundary portions 22 that change from a region having a relatively small liquid droplet contact angle (the abutting faces 20B, 21A and 21C that become the water repellent untreated surfaces 11) to a region having a relatively large liquid droplet contact angle (the abutting faces 20A, 20C and 21B that become the water repellent treated surfaces 10), along the water infiltration direction A. In the fourth exemplary embodiment, three boundary portions 22 that serve as boundaries that change from a region having a relatively small liquid droplet contact angle (the water repellent untreated surfaces 11) to a region having a relatively large liquid droplet contact angle (the water repellent treated surfaces 10) are provided as shown by the reference symbols 22A, 22B and 22C. Moreover, in the present fourth exemplary embodiment, those boundary portions 22 (22A, 22B and 22C) that become the boundaries are alternately installed on the first case member 1 and the second case member 2 along the water infiltration direction A.

In this manner, the effect of preventing the infiltration of a liquid by controlling the liquid droplet contact angle of the abutting faces 20A to 20C and 21A to 21C of the case members 1 and 2 at the facing region 23 of the case members 1 and 2 occurs at the boundary portions 22 (22A, 22B and 22C) that change from a region having a relatively small liquid droplet contact angle to a region having a relatively large liquid droplet contact angle. That is to say, by increasing the number of boundary portions 22 (22A, 22B and 22C) that serve as boundaries that change from the water repellent untreated surface 11 to the water repellent treated surface 10, even if water has infiltrated by breaching the first boundary portion 22A, it is possible to suppress further infiltration of the water at the second and subsequent boundary portions 22B and 22C.

In the waterproof structure for an electric device shown in this fourth exemplary embodiment that was described in detail above, at the abutting ends portion 102 defined by the case members 1 and 2 that constitute the housing 100, a plurality of the boundary portions 22 (22A, 22B, and 22C) that serve as boundaries that change from a region having a relatively small liquid droplet contact angle (the water repellent untreated surface 11) to a region having a relatively large liquid droplet contact angle (the water repellent treated surface 10) are alternately installed on the first case member 1 and the second case member 2 along the water infiltration direction A. With this kind of waterproof structure, even if water has infiltrated by breaching the first boundary portion 22A, it is possible to suppress further infiltration of the water at the second and subsequent boundary portions 22B and 22C, and it is possible to impart sufficient waterproof performance to the housing 100 of the electronic device.

In addition, according to the waterproof structure of the present exemplary embodiment, by forming two or more of each of the plurality of edge portions 7 (22A, 22B and 22C) that serve as boundaries that change from the region having a relatively small liquid droplet contact angle (water repellent untreated surface 11) to the region having a relatively large liquid droplet contact angle (water repellent treated surface 10) along the infiltration direction of a liquid, it is possible to exhibit a sufficient water infiltration preventive effect that does not impede miniaturization and slimming.

In the fourth exemplary embodiment, compared to the first to third exemplary embodiments, although there are such problems as the effect of structurally weakening the momentum of water that infiltrates facing region 23 being diminished due to the abutting ends portion 102 of the first case member 1 and the second case member 2 being two-dimensional flat surfaces, and the gap 5 easily widening from impacts or the passage of time, it is possible to form the water repellent treated surface 10 with a simpler process, and it is possible to obtain sufficient waterproof performance.

In all of the first to fourth exemplary embodiments, a treatment solution in which a polymer having high water repellency is dispersed is employed as the treatment solution used in the water repellent processing. However, as a substitute a treatment solution may be used in which a monomolecule having water repellency such as alkoxysilane, or a fluorocarbon or a hydrocarbon having a group that generates a silanol by hydrolysis is dissolved. In the case of using a treatment solution in which a monomolecule has been dissolved, the material of the first case member 1 and the second case member 2 is preferably a metallic material from the standpoint of adhesion, but may also be a resin material.

In the case of forming a monomolecule water repellent film on a resin material, it is possible to form a water repellent film with higher adhesion by forming an adhesive layer on the case members 1 and 2 in advance by a primer treatment. Also, in all of the exemplary embodiments, a coating method is used for the water repellent treatment to the surfaces of the cases 1 and 2. However, the method is not limited thereto, and a component having high water repellency such as fluorine may be formed by vapor deposition on the case members 1 and 2 in a state of the regions where it is not to be formed being masked.

In the aforementioned first to fourth exemplary embodiments, the case members 1 and 2 that constitute the housing 100 are constituted by two members. However, the housing 100 may be constituted by three or more case members, and the water repellent treated surface 10, and the aforementioned water repellent untreated surface 11/hydrophilic treated surface 12 may be provided in the gaps between the case members. Also, in the aforementioned first to fourth exemplary embodiments, the water repellent treated surface 10 is provided on both the end portion 3 of the case member 1 and the end portion 4 of the case member 2 that constitute the housing 100. However, it is not limited thereto, and the water repellent treated surface 10 may be provided only on either one of the end portion 3 of the case member 1 and the end portion 4 of the case member 2.

Exemplary embodiments of the present invention have been explained with reference to the drawings above, but the concrete constitutions are not limited to these exemplary embodiments, and design modifications are included without departing from the scope of the present invention. Also, the shape of the abutting ends portions 101 and 102 that are shown in the exemplary embodiments of the present invention is one used for describing in a straightforward manner, and therefore it should not be construed that the exemplary embodiments of the present invention are applicable exclusively with this shape.

This application is based upon and claims the benefit of priority from Japanese patent application No. 2009-119056, filed on May 15, 2009, the disclosure of which is incorporated herein in its entirety by reference.

INDUSTRIAL APPLICABILITY

The present invention is applicable to a waterproof structure of a portable electronic device such as an ultra mobile personal computer (UMPC) has become popular in recent years, in addition to a mobile telephone and a smartphone.

REFERENCE SYMBOLS

1 First case member
2 Second case member
3 End face
3A Abutting face
3B Abutting face
3C Abutting face
4 End face
4A Abutting face
4B Abutting face
4C Abutting face
5 Gap
6 Facing region
7 (7A to 7E) Edge portion
10 Water repellent treated surface
11 Water repellent untreated surface
12 Hydrophilic treated surface
20 End face
20A Abutting face
20B Abutting face
20C Abutting face
21 End face
21A Abutting face
21B Abutting face
21C Abutting face
22 (22A to 22C) Boundary portion
23 Facing region
100 Housing
101 Abutting ends portion
102 Abutting ends portion

The invention claimed is:

1. A waterproof structure for an electronic device comprising a housing including:
   a first case member including a first plurality of abutting faces, and
   a second case member including a second plurality of abutting faces, each facing one of the first plurality of abutting faces,
   wherein a water repellent treatment is applied to at least one of the first plurality of abutting faces and at least one of the second plurality of abutting faces,
   wherein two or more boundaries between a first region and a second region having a larger liquid droplet contact angle than that of the first region are provided along a liquid infiltration direction at an abutting ends portion of the first and second case members, and
   wherein a hydrophilic treated surface and a water repellent treated surface are alternatively installed on the first plurality of abutting faces and on the second plurality of abutting faces.

2. The waterproof structure for an electronic device according to claim 1, wherein each of the two or more boundaries and edge portions that serves as a shape boundary of the abutting ends portion coincide with each other.

3. The waterproof structure for an electronic device according to claim 2, wherein the abutting ends portion is formed in a stepped shape by the edge portions.

4. The waterproof structure for an electronic device according to claim 1, wherein the first plurality of abutting faces of the first case member are formed in a two-dimensional planar shape, and the second plurality of abutting faces of the second case member are formed in a two-dimensional planar shape.

5. The waterproof structure for an electronic device according to claim 1, wherein a hydrophilic treatment is applied to the first region.

6. The waterproof structure for an electronic device according to claim 1, which is configured to prevent infiltration of water through the abutting ends portions.

7. The waterproof structure for an electronic device according to claim 1, wherein:

the first region has a the hydrophilic treated surface to which the hydrophilic treatment is applied, and the second region has the water repellent treated surface to which the water repellent treatment is applied.

* * * * *